(12) United States Patent
Folts

(10) Patent No.: US 8,189,324 B2
(45) Date of Patent: May 29, 2012

(54) POWER ELECTRONIC ASSEMBLY WITH SLOTTED HEATSINK

(75) Inventor: Douglas C. Folts, Baraboo, WI (US)

(73) Assignee: American Superconductor Corporation, Devens, MA (US)

(*) Notice: Subject to any disclaimer, the term of this patent is extended or adjusted under 35 U.S.C. 154(b) by 0 days.

(21) Appl. No.: 12/632,379

(22) Filed: Dec. 7, 2009

(65) Prior Publication Data
US 2011/0134609 A1    Jun. 9, 2011

(51) Int. Cl.
*H05K 7/20* (2006.01)

(52) U.S. Cl. ... 361/676; 361/631; 361/643; 361/679.46; 361/688; 361/716; 257/718; 257/726; 363/96; 363/137; 363/141

(58) Field of Classification Search .................. 361/601, 361/611, 631, 637, 643, 647, 676, 679.46, 361/679.54, 704, 707, 71, 1, 712, 715
See application file for complete search history.

(56) References Cited

U.S. PATENT DOCUMENTS

| | | | |
|---|---|---|---|
| 3,573,574 A | | 4/1971 | Davis et al. |
| 4,080,645 A | | 3/1978 | Schilling et al. |
| 4,578,745 A | * | 3/1986 | Olsson .................. 363/68 |
| 5,168,348 A | * | 12/1992 | Chu et al. .................. 257/713 |
| 5,870,300 A | * | 2/1999 | Blidberg et al. .............. 363/132 |
| 6,028,355 A | * | 2/2000 | Gates .................. 257/706 |
| 6,266,881 B1 | * | 7/2001 | Takigawa et al. ........ 29/890.039 |
| 6,317,322 B1 | * | 11/2001 | Ueki et al. .................. 361/700 |
| 6,320,268 B1 | | 11/2001 | Lang et al. |
| 7,091,703 B2 | | 8/2006 | Folts et al. |
| 7,248,478 B2 | * | 7/2007 | Inoue .................. 361/699 |
| 7,851,267 B2 | * | 12/2010 | Specht et al. .................. 438/121 |
| 2002/0008963 A1 | * | 1/2002 | DiBene et al. .................. 361/720 |
| 2004/0052052 A1 | * | 3/2004 | Rivera .................. 361/700 |
| 2006/0109626 A1 | * | 5/2006 | Harris et al. .................. 361/695 |
| 2006/0138452 A1 | | 6/2006 | Knapp et al. |
| 2009/0091892 A1 | * | 4/2009 | Otsuka et al. .................. 361/715 |

FOREIGN PATENT DOCUMENTS

| | | |
|---|---|---|
| DE | 2529954 | 11/1976 |
| EP | 1494278 | 1/2005 |
| WO | 2009/132723 | 11/2009 |

* cited by examiner

*Primary Examiner* — Courtney Smith
(74) *Attorney, Agent, or Firm* — Occhiuti Rohlicek & Tsao LLP

(57) ABSTRACT

A power electronic assembly includes a pair of thermally and electrically conductive plates, and semiconductor switching elements positioned between contact surfaces of the pair of conductive plates. A first of the semiconductor switching elements is positioned at a first region of the conductive plates, and a second of the semiconductor switching elements positioned at a second region of the conductive plates. At least one of the conductive plates includes an aperture positioned between the first region and the second region of the conductive plates, such that in a compressed state, a contact surface of the conductive plate associated with the first region is substantially parallel to and offset from that of the second region in a direction parallel to the direction of compression.

13 Claims, 9 Drawing Sheets

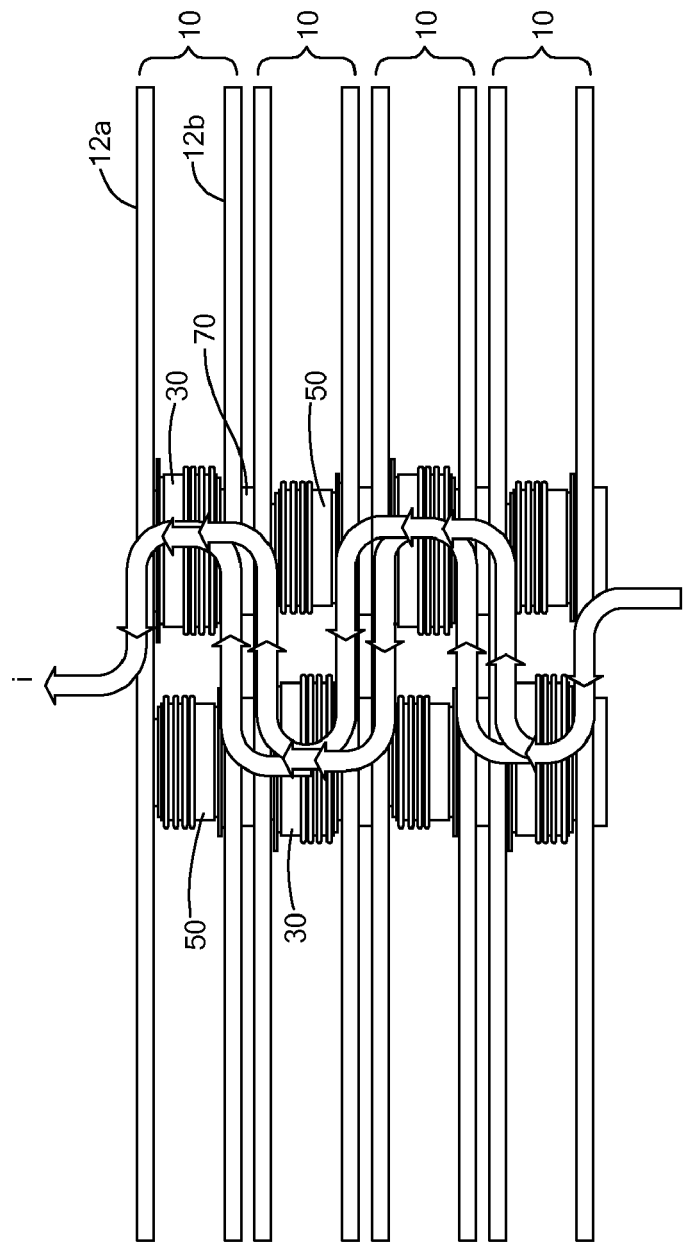
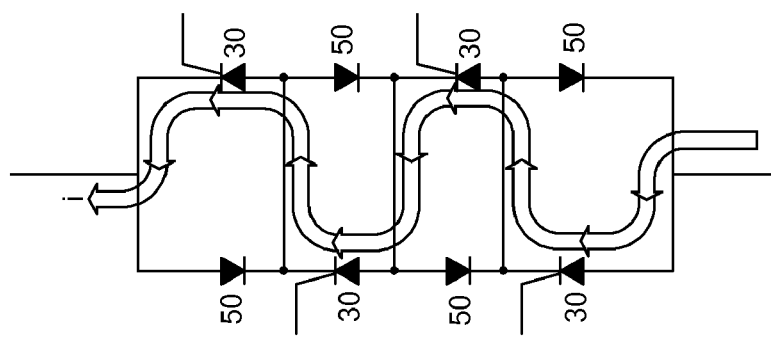
FIG. 2

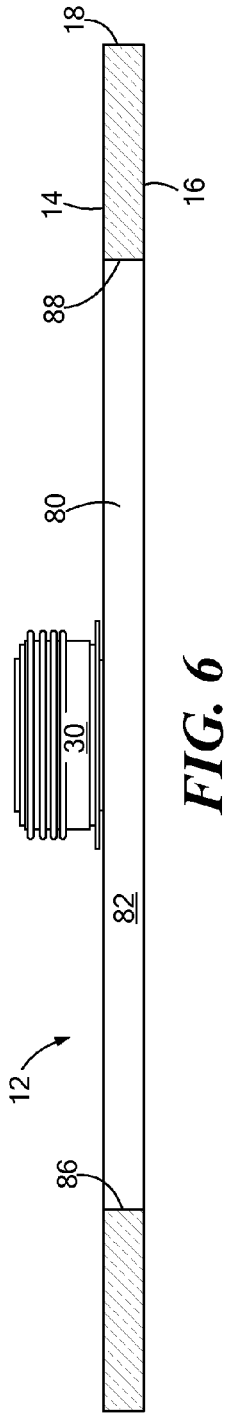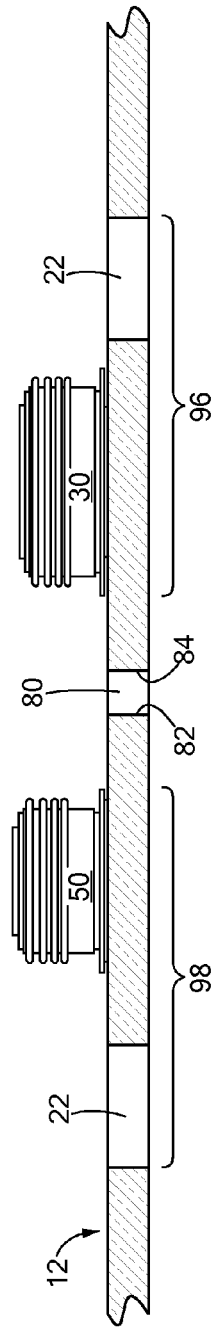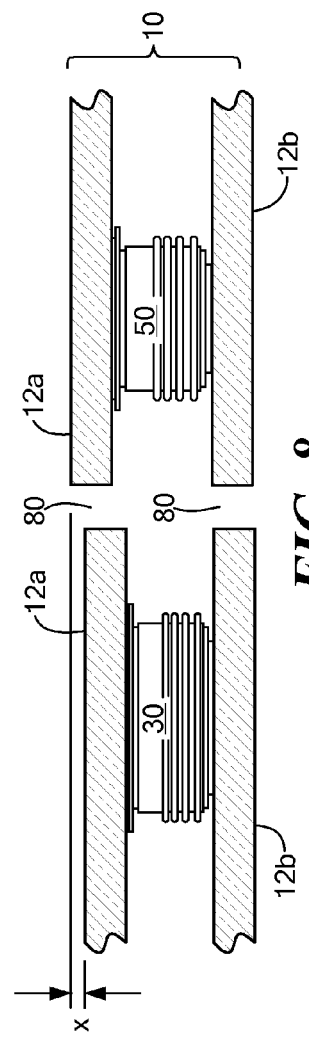

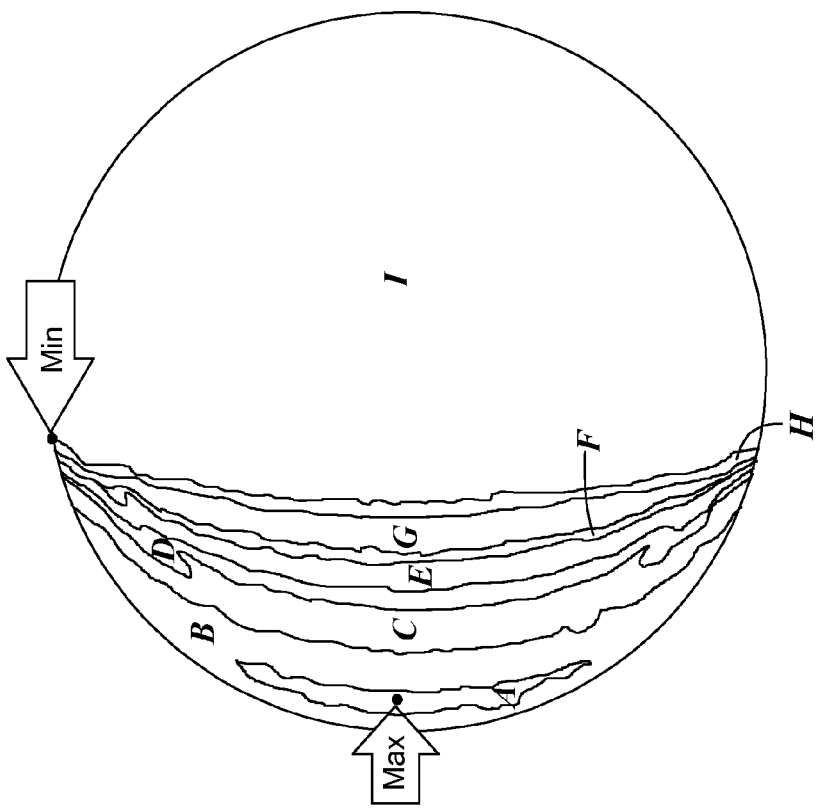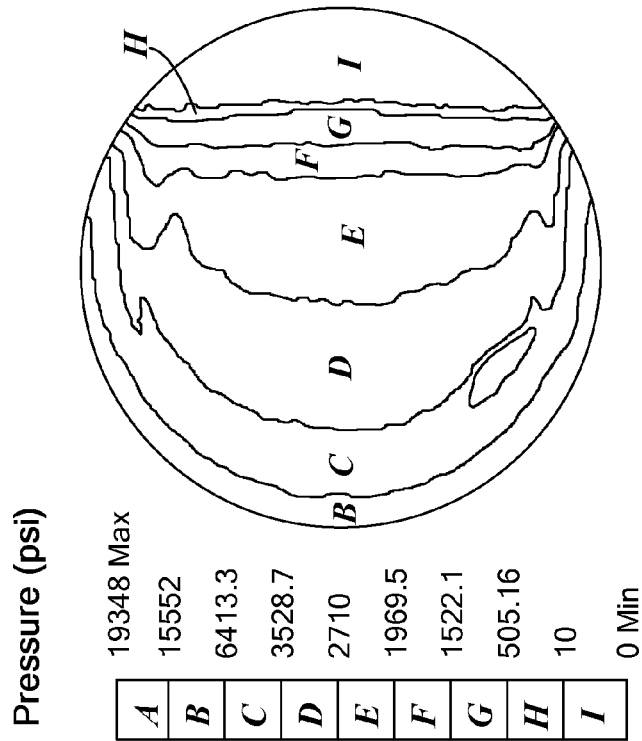
FIG. 10

POWER ELECTRONIC ASSEMBLY WITH SLOTTED HEATSINK

BACKGROUND OF THE INVENTION

To remain competitive, electrical utility companies continually strive to improve system operation and reliability while reducing costs. To meet these challenges, utility companies are developing techniques for increasing the life of installed equipment, as well as, diagnosing and monitoring their utility networks.

An example of the type of installed equipment used by utility companies to address voltage instability and collapse problems is the static VAR compensator (SVC), which serves to remove the losses contributing to the huge increase in current by temporarily injecting reactive power into the network. An SVC typically includes valves or switching elements in the form of thyristor-switched capacitors (TSC) and thyristor switched reactors (TSR). These semiconductor switching elements are packaged in a cylindrical ceramic "press-pack" and arranged in pairs between two flat, copper plates. The plates are electrically and thermally conductive members, and are used as heat sinks for the semiconductor switching elements, as well as to apply an external clamping pressure to the press-pack, which is required to permit the silicon semiconductor within the package to make electrical and thermal contact with the soft copper pole faces of the package. Multiple assemblies of switching element pairs sandwiched between plate pairs are required to be connected in series to conduct and/or control both polarities of the AC current. Thus, multiple assemblies are stacked to facilitate the series connection of multiple lower voltage rated devices to achieve compensation for the higher system voltage. The resulting valve is operated under dielectric oil which serves as high voltage insulation and as a thermal heat transfer fluid. Because of the high thermal conductivity of the dielectric oil, the plates which sandwich the semiconductor switching elements serve as heat sinks to transfer heat generated in the power semiconductors to the oil. In addition, the plates establish the electrical connection between semiconductor switching element pairs of a given assembly.

SUMMARY

In some aspects, a power electronic assembly is provided. The power electronic assembly includes a pair of thermally conductive plates and semiconductor switching elements positioned between contact surfaces of the pair of thermally conductive plates. A first of the semiconductor switching elements is positioned at a first region of the thermally conductive plates and a second of the semiconductor switching elements is positioned at a second region of the thermally conductive plates. In addition, at least one of the thermally conductive plates includes an aperture positioned between the first region and the second region of the thermally conductive plates, such that in a compressed state, a contact surface of the at least one of the thermally conductive plates associated with the first region is substantially parallel to and offset from that of the second region in a direction parallel to the direction of compression.

The power electronic assembly may include one or more of the following features. At least one of the thermally conductive plates comprises the contact surface and a second surface that is opposed to the contact surface, and the aperture extends from the contact surface to the second surface. Both plates of the pair of thermally conductive plates include an aperture positioned between the first region and the second region. The aperture is elongated in the plane of the at least one of the thermally conductive plates. The aperture includes substantially parallel long sides connected at each end by short sides, and the ratio of length of long sides to short sides is about 50 to 1. The aperture includes substantially parallel long sides connected at each end by short sides, and the ratio of length of long sides to short sides is about 200 to 1. The aperture is elongated, and extends along a line substantially perpendicular to a line joining the first and the second of the semiconductor switching elements. The aperture includes long aperture sides joined by short aperture sides, and the first and the second semiconductor switching elements are located at a position spaced from the short aperture sides. The aperture includes long aperture sides joined by short aperture sides, and a line that connects the first and second semiconductor switching elements intersects the aperture at a location substantially midway between the short aperture sides. The aperture is linear. At least one of the thermally conductive plates provides an electrical connection between the first of the semiconductor switching elements and the second of the semiconductor switching elements. Each of the first and second semiconductor switching elements includes a positive terminal and a negative terminal, and wherein one of the pair of thermally conductive plates provides an electrical connection between the positive terminal of the first semiconductor switching element and the negative terminal of the second semiconductor switching element, and the other of the pair of thermally conductive plates provides an electrical connection between the negative terminal of the first semiconductor switching element and the positive terminal of the second semiconductor switching element. At least two assemblies are provided, wherein the at least two assemblies are arranged so that the respective apertures are substantially aligned along a longitudinal axis of the valve.

In some aspects, a power electronic assembly is provided. The power electronic assembly includes a pair of thermally conductive plates and semiconductor switching elements positioned between contact surfaces of the pair of thermally conductive plates. A first of the semiconductor switching elements is positioned at a first region of the thermally conductive plates and a second of the semiconductor switching elements is positioned at a second region of the thermally conductive plates. In addition, at least one of the thermally conductive plates is configured so that in a compressed state, a contact surface of the at least one of the thermally conductive plates associated with the first region is substantially parallel to and offset from that of the second region in a direction parallel to the direction of compression due to resiliency of the at least one of the thermally conductive plates.

Use of slotted heat sink plates is advantageous since it decouples the regions of contact of the respective semiconductor switching elements. In particular, the slot is an elongated opening through the plate that is disposed between the respective semiconductor switching elements. This configuration reduces the stiffness of the plate in the area directly between the switching elements.

When slotted heat sink plates are used, the mechanical forces applied to the pole surfaces of the semiconductor switching elements arising from a height mismatch between the elements must travel a longer distance, for example, from one device around the aperture to the other device. This longer distance increases the plate mechanical compliance, adding resilience to the heat sink in the region between the two devices. As a result, the mechanical forces applied to the pole surfaces are symmetrically distributed. This in turn permits a reliable thermal and electrical contact to be established between the switching element and the plate, and increases the area through which current is conducted between these members.

By providing electrically and thermally conductive compression plates, the semiconductor switching element pair can be clamped between common heat sinks. This automatically establishes an electrical connection between the switching elements, and thus avoids added material and labor expense associated with providing separate heat sinks and electrical connections for each switching element. Moreover, the resultant assembly is substantially smaller than the prior art of separately clamping and providing heatsinks for each series-connected set of semiconductor switching elements.

BRIEF DESCRIPTION OF THE DRAWINGS

FIG. 2 shows the electrical connections between assemblies for a four-assembly portion of the valve during one half of the AC line cycle, illustrating the current path through the valve during the one half AC line cycle.

FIG. 6 is a sectional view of the slotted heat sink plate of FIG. 5 as seen along line 6-6.

FIG. 7 is a sectional view of the slotted heat sink plate of FIG. 5 as seen along line 7-7.

FIG. 8 is a sectional view of a portion of an assembly of a thyristor-diode pair disposed between slotted heat sink plates.

FIG. 10 is an illustration of the calculated pressure distribution across a pole face of each of the diode (left) and thyristor (right) for a height mismatch of 0.02 inches between the diode (taller) and thyristor (shorter) for an assembly employing non-slotted heat sink plates.

DETAILED DESCRIPTION

Figure 1:
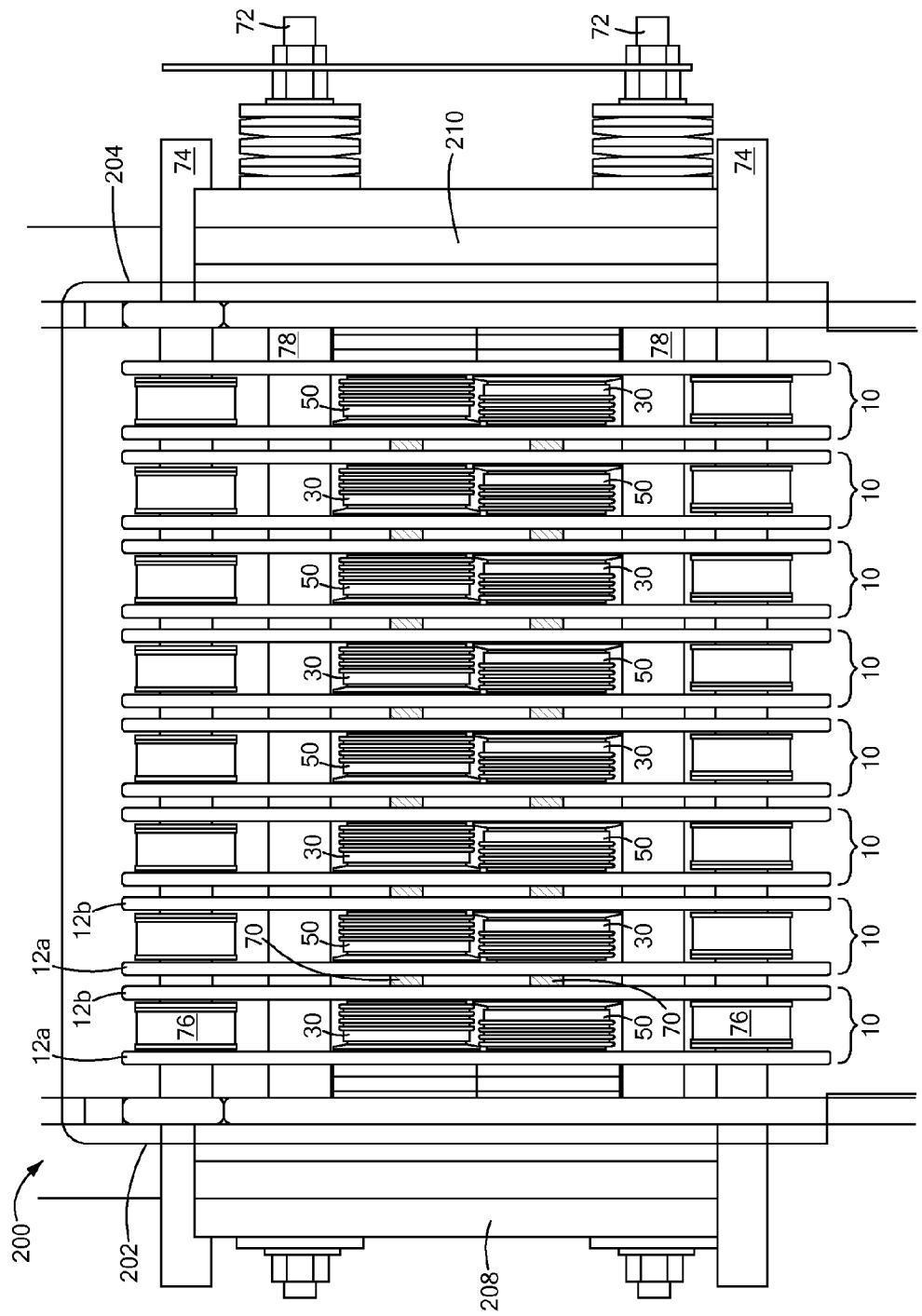
FIG. 1 is a side view of the semiconductor switching elements of a thyristor switched capacitor valve.

Referring to FIG. 1, a thyristor-switched capacitor includes a series of stacked assemblies 10 of semiconductor switching element pairs. Each assembly 10 includes a semiconductor switching element pair disposed between a two substantially parallel plates 12a, 12b. Plates 12a, 12b are configured to provide heat transfer and current flow between the respective switching elements and the plates 12a, 12b. In particular, as will be discussed in greater detail below, plates 12a, 12b include features which provide improved symmetry and uniformity in the clamping pressure to the switching elements, resulting in improved heat transfer and current flow.

In the illustrated embodiment, the semiconductor switching element pair includes a thyristor 30 and a diode 50. Multiple assemblies 10 are stacked side-by-side to form a valve 200. In the valve 200, each assembly 10 is placed adjacent to another assembly 10 so that the plates 12a, 12b of one assembly 10 are substantially parallel to the plates 12a, 12b of the adjacent assembly 10, and so that the peripheral edges 18 of the plates 12a, 12ba of the respective assemblies 10 are flush. However, assemblies 10 including a paired thyristor 30 and diode 50 are generally not of equal heights. In particular, a device height mismatch frequently occurs due to the differences in respective device heights of thyristor 30 and diode 50. Even in embodiments in which the semiconductor switching element pair includes a pair of thyristors 30 having the same nominal height, normal manufacturing tolerances can result in a subtle height mismatch. As a result, when the device pair is clamped between plates of a conventional valve, a significant pressure variation exists across the pole faces of each respective device. This configuration can result in unreliable operation of the semiconductor switching elements because without uniform and adequate clamping pressure, thermal heat transfer is impaired and current flow between the switching element and the plate is concentrated into the small area with the highest clamping pressure. In order to partially offset the effect of the height differences between the thyristor 30 and diode 50, the respective positions of the thyristor 30 and diode 50 are switched in adjacent assemblies 10. As a result, as viewed along a line extending from one end 202 of the valve 200 to the other end 202, the position of the respective thyristors 30 alternate with that of the diodes 50.

Referring to FIG. 2, each assembly 10 is spaced apart from, and serially electrically connected to, an adjacent assembly 10 via cylindrical copper stubs 70 disposed between plates 12a, 12b of adjacent pairs. The thyristor 30 and the diode 50 are electrically connected in inverse parallel. In particular, the cathode of the diode 50 is connected to the anode of the thyristor 30 via the plate 12a or 12b.

Figure 3:
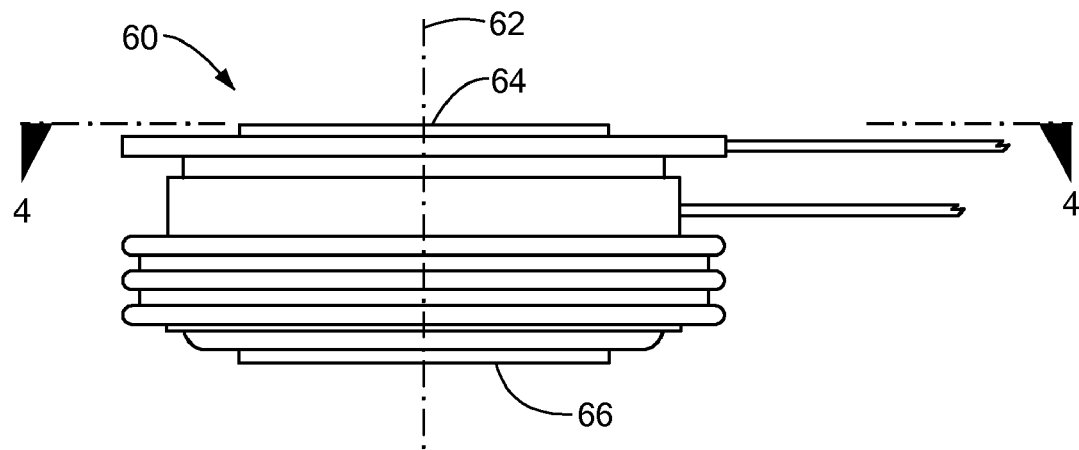
FIG. 3 is a side view of a press pack.
Figure 4:
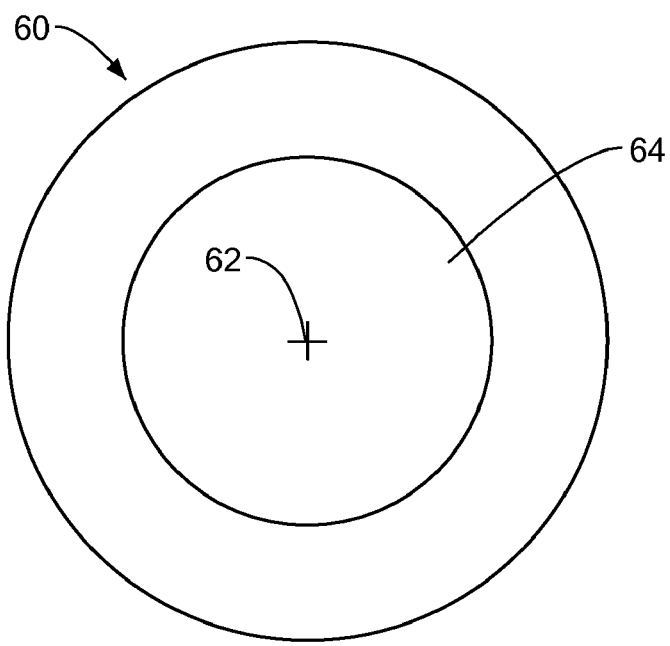
FIG. 4 is an end view of the press pack of FIG. 3 as seen along line 4-4.

Referring to FIGS. 3 and 4, the semiconductor switching elements 30, 50 are packaged in cylindrical press-packs 60, in which the semiconductor wafer floats within the interior space of the package, and axial compression of the press pack 60 is required to achieve an electrical and thermal connection of the semiconductor wafer with the opposed pole faces (terminals) 64, 66 of the press pack 60. For example, the thyristor 30 may be a silicon controlled rectifier such as Type K0769NC650 Medium Voltage Thyristor sold by Westcode Semiconductors Ltd, and the diode 50 may be a rectifier diode Type W1032LC600 sold by Westcode Semiconductors Ltd. Thus, in use the valve 200 is loaded under compression, so that sufficient compression force is applied to the plates 12a, 12b of each assembly 10 to achieve electrical and thermal connection of the thyristor 30 and diode 50 with the respective plates 12a, 12b.

Referring again to FIG. 1, a pair of threaded clamping rods 72 extend through rod openings 22 in the plates 12a, 12b. The clamping rods 72 extend through the plates 12a, 12b from one end 202 of the valve 200 to the opposed end 204, and serve to maintain the plates 12a, 12b in the stacked configuration and also to apply a compression force to the valve 200 as discussed further below. Each clamping rod 72 is housed in an insulating conduit 78 that insulates the clamping rods 72 from the plates 12a, 12b. In addition, support tubes 74 extend through tube openings 20 in the plates 12a, 12b. Like the clamping rods 72, the support tubes 74 extend through the plates 12a, 12b from one end 202 of the valve 200 to the other 204. The support tubes 74 support other components of the assembly 10 between the plates 12a, 12b. For example, conduits 74 are used to support toroid shaped transformers 76 which provide the gate drive signals to the thyristor 30. The conduits 78 and support tubes 74 are laminated with glass insulation so as to be thermally and electrically insulated from the plates 12a, 12b.

Figure 5:
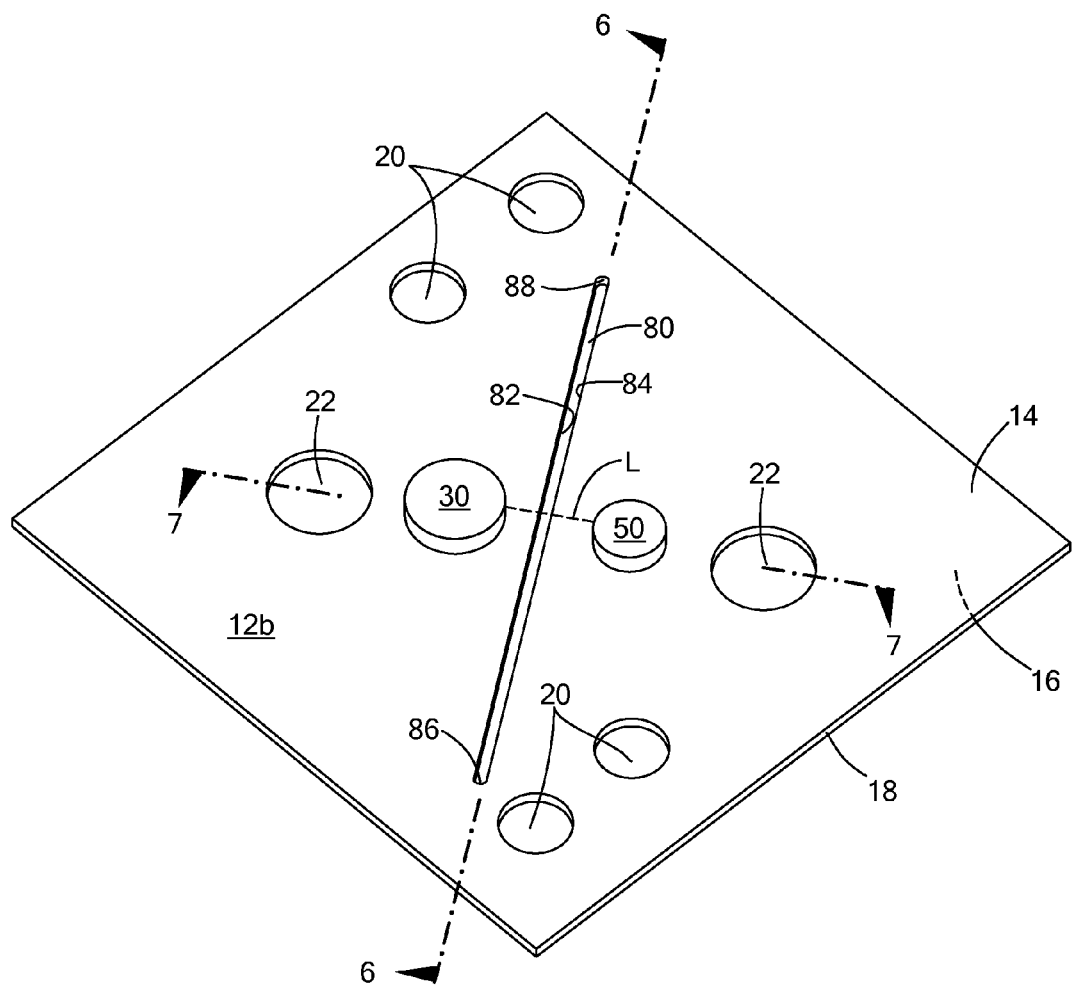
FIG. 5 is a top perspective view of a slotted heat sink plate.

Referring also to FIGS. 5-7, each plate 12 is a thermally and electrically conductive member. The plate 12 is flat, substantially uniform in thickness, and generally rectangular in peripheral shape. In some embodiments, the plate 12 is formed of copper. Each plate 12 includes a first surface 14, and a second surface 16 opposed to the first surface 14 and separated from the first surface by the thickness of the plate. The plate 12 also includes the openings 20, 22 through which clamping rods 72 and support tubes 74 respectively extend. The openings 20, 22 are distributed outside a mid region of the plate. For example, the clamping rods 72 are generally midway between a center of the plate 12 and its peripheral edge 18, and the support tubes 72 are disposed adjacent the peripheral edge 18.

Each plate 12 also includes an elongate aperture or slot 80 that extends completely through the plate 12 from the first surface 14 to the second surface 16. The slot 80 is elongated in the plane of the plate 12, and includes substantially parallel long sides 82, 84 that are connected at each end by short sides 86, 88. The slot 80 is thin, that is, the long sides of the slot 82, 84, which correspond to the slot length, are much longer than the short sides of the slot 86, 88, which correspond to slot width. In one example, in some embodiments, the ratio of slot length to slot width is about 3 to 1. In other embodiments, the ratio of slot length to slot width is about 50 to 1. In still other embodiments, the ratio of slot length to slot width is about 200 to 1. In another example, in some embodiments, the slot width generally corresponds to that of the thickness of the plates 12a, 12b and the slot length is maximized in accordance with constraints discussed below.

The slot 80 extends substantially linearly in the plane of the plate 12 such that the short sides 86, 88 are adjacent to, but spaced apart from, opposed portions of the peripheral edge 18 of the plate 12. That is, the slot 80 extends across the mid portion of the plate 12 but does not extend to the peripheral edge 18, whereby the plate 12 is continuous in the vicinity of the peripheral edge 18. This continuity of the periphery of the plate 12 is important to provide sufficient cross sectional area to permit adequate current flow between the respective terminals of the thyristor 30 and diode 50 without generating hot-spots within the plate 12.

At the same time, the slot 80 is made as long possible while maintaining plate integrity and adequate current flow area. Here, the slot 80 decouples a first region 96 of the plate 12 associated with one of the semiconductor switching elements, such as the thyristor 30, from a second region 98 of the plate 12 associated with the other of the semiconductor switching elements, in this case the diode 50. By making the length of the slot 80 as long as possible, the mechanical decoupling of the first region 96 from the second region 98 is maximized.

The thyristor 30 and diode 50 are disposed in the mid portion of the plate, and are spaced apart from each other. The slot 80 is located between the thyristor 30 and diode 50. In some embodiments, an imaginary line L that connects the thyristor 30 and the diode 50 intersects the slot 80 at a location between the short sides 86, 88 of the slot. That is, the semiconductor switching elements 30, 50 are located at a position spaced from the slot ends 86, 88. In some embodiments, the line L that connects the thyristor 30 and the diode 50 intersects the slot 80 at a location substantially midway between the short sides 86, 88 of the slot. In some embodiments, the line L that connects the thyristor 30 and the diode 50 intersects and is perpendicular to the slot 80.

Referring again to FIG. 1, in the illustrated embodiment, the valve 200 includes eight individual assemblies 10, each of which includes the thyristor 30 and diode 50 sandwiched between plates 12a, 12b. The assemblies are arranged side-by-side as described above, and a compression load is applied to the opposed ends 202, 204 of the valve 200. This can be accomplished, for example, by sandwiching the valve 200 between a fixed base 208 and a movable base 210, each mounted on the clamping rods 72 in parallel with the plates 12a, 12b of the assemblies 10. The movable base 210 is driven toward the fixed base 208 by tightening nuts engaged with the threaded ends of the clamping rods 72. As a result, each assembly 10 is loaded in compression. In particular, sufficient compression force is applied to each assembly 10 to achieve electrical and thermal connection of the thyristor 30 and diode 50 with the respective plates 12a, 12b. For example, the applied compression force may be about 20 kN.

The valve 200 is enclosed in a tank (not shown) and is operated in dielectric oil which serves as a high voltage insulation and as a thermal heat transfer fluid. Because of the high thermal conductivity of the dielectric oil, the flat copper plates 12a, 12b serve not only as electrical conductors between the thyristor-diode pairs of a given assembly 10, but also serve as heat sinks to transfer heat generated in the semiconductor switching devices to the oil. In use, the valve 200 is arranged so that the plates 12a, 12b of each assembly lie in a vertical plane so as to promote efficient heat convection through the dielectric oil.

As seen in FIG. 8, by adding a slot 80 to the plates 12a,12b, the plate stiffness is reduced in the vicinity of the slot 80. Here, the slot 80, positioned between the first region 96 and the second region 98 of each of the plates 12a, 12b, permits a contact surface of plates 12a, 12b associated with the first region to be oriented substantially parallel to and offset a distance x from that of the second region in a direction parallel to the direction of compression.

Figure 9:
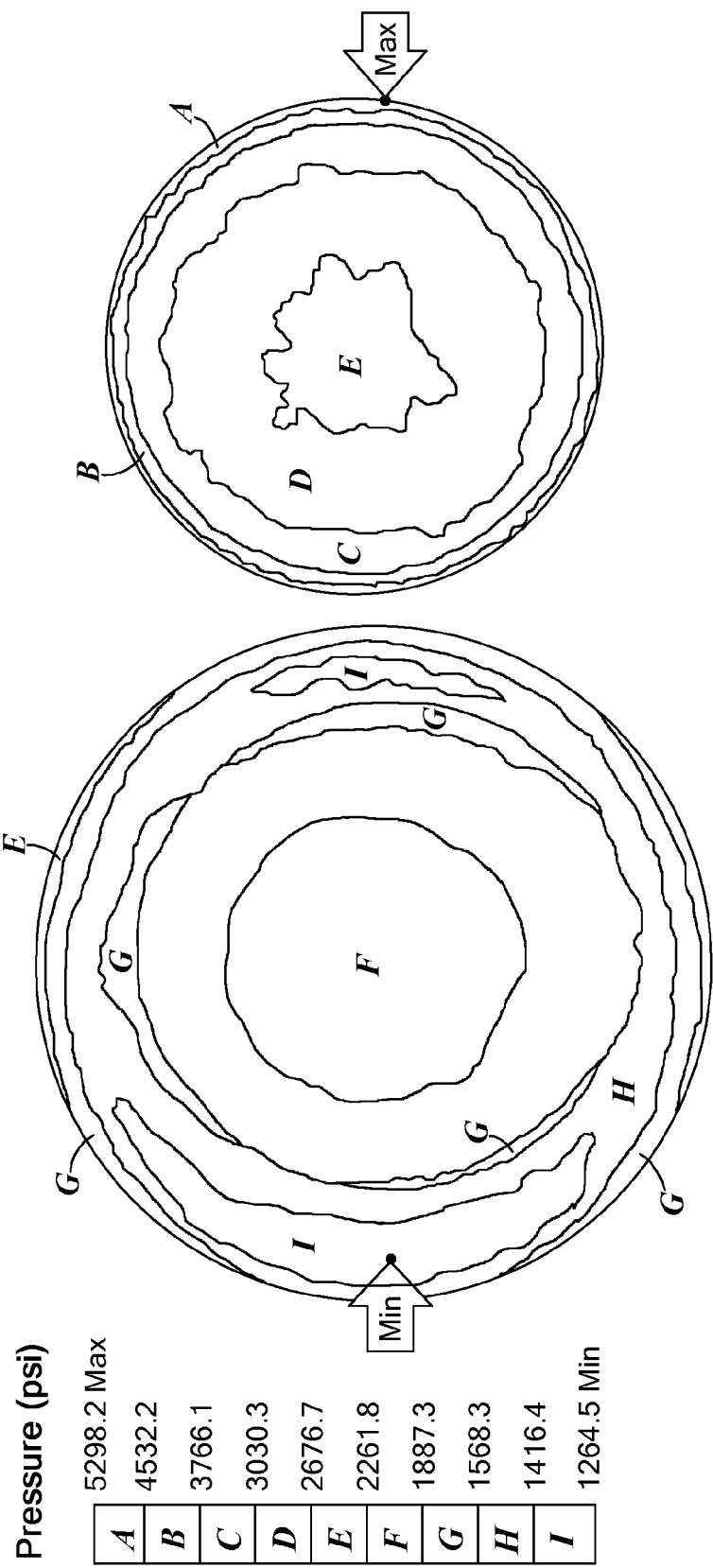
FIG. 9 is an illustration of the calculated pressure distribution across a pole face of each of the thyristor (left) and diode (right) for a height mismatch of 0.02 inches between the thyristor (shorter) and diode (taller) for an assembly employing slotted heat sink plates.

Referring to FIGS. 9 and 10, when first and second regions 96, 98 of the plates 12a, 12b are decoupled, the pressure distribution across the pole faces of both the thyristor 30 and the diode 50 are made much more uniform and symmetric as compared to an assembly without slotted plates. FIG. 9 represents the calculated pressure distribution across the pole face of each of the thyristor (left) and diode (right) for a height mismatch of 0.02 inches, where the axial length of the diode is greater than that of the thyristor, and the plates 12a, 12b include slots as described above. As seen in this figure, the pressure distribution is across the pole faces 64, 66 are radially symmetric about a longitudinal axis 62 of the respective semiconductor switching element 30, 50. In contrast, FIG. 10 represents the calculated pressure distribution across the pole face of each of the diode (left) and thyristor (right) for a height mismatch of 0.02 inches, where the heat sink plates 12a, 12b are formed without a slot. As seen in FIG. 10, the pressure is disproportionately distributed over the pole face of the device such that pressure is concentrated to one side of the device surface. In particular, the pole face of the thyristor experiences substantially all the applied load at a lateral one-third of the pole face, and the remaining two-thirds of the pole face experiences a zero load. The pole face of the diode is also unevenly distributed to one side. This configuration can result in unreliable operation of the semiconductor switching elements because without adequate clamping pressure and uniformity, thermal heat transfer is impaired and current flow is concentrated into the small area with the highest clamping pressure.

Figure 11:
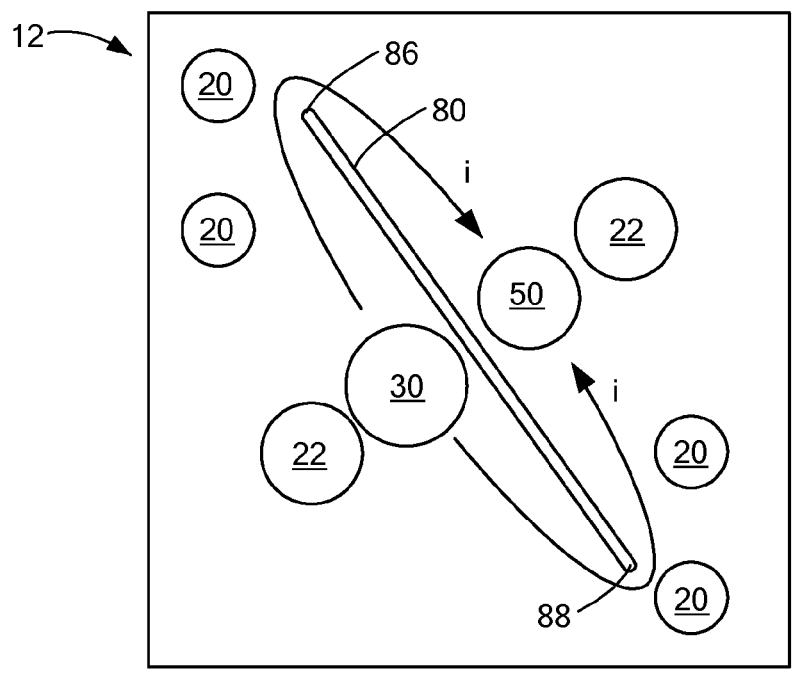
FIG. 11 is a top plan view of the slotted heat sink plate of FIG. 5 illustrating the current path through the plate.

Referring to FIG. 11, due to the presence of the slot 80 between the thyristor 30 and the diode 50, current (represented by the arrows labeled i in the figure) flowing within the plate 12 between the thyristor 30 and the diode 50 must travel around the ends 86, 88 of the slot 80. Referring also to FIG. 2, for each AC half-cycle, current must transfer from one side of the slot for a given level 10 to the other side of the slot on adjacent levels. This is because the physical position of the thyristor 30 and diode 50 alternate from one level to the next. This alternating placement of the devices 30, 50 nulls the cumulative nominal differential thickness of semiconductor switching elements from one end 202 of the valve 200 to the other end 202. This necessary current transfer requires that there be sufficient cross-sectional area between the end of the slot at 86 and 88 and other plate features such as the opening 20 and the peripheral edges 18.

Figure 12:
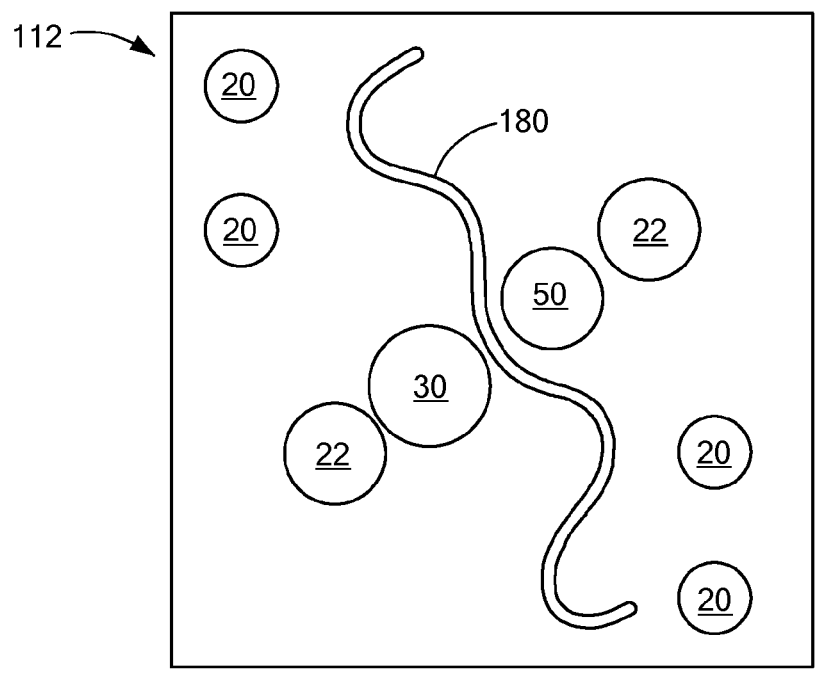
FIG. 12 is another embodiment of the slotted heat sink plate.
Figure 13:
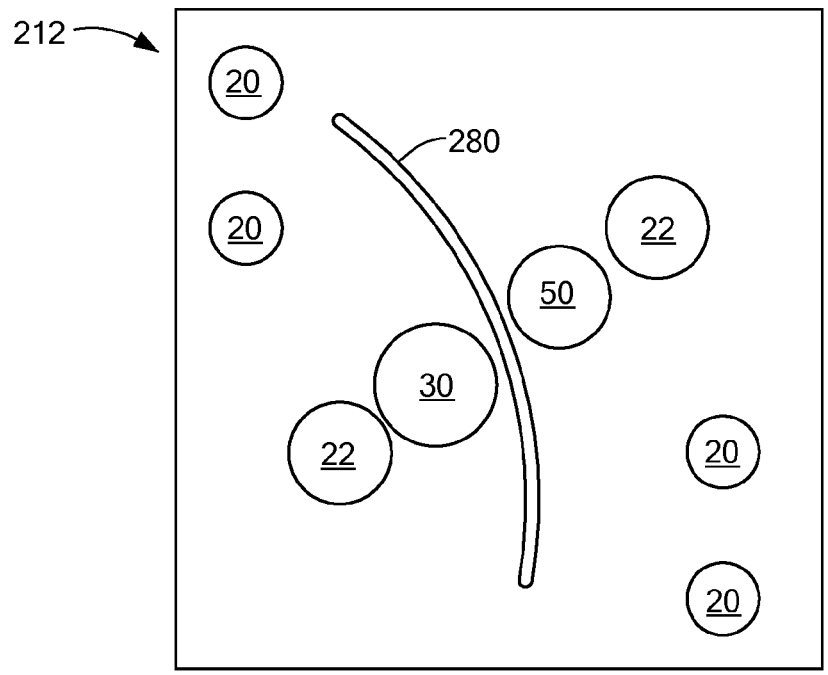
FIG. 13 is another embodiment of the slotted heat sink plate.
Figure 14:
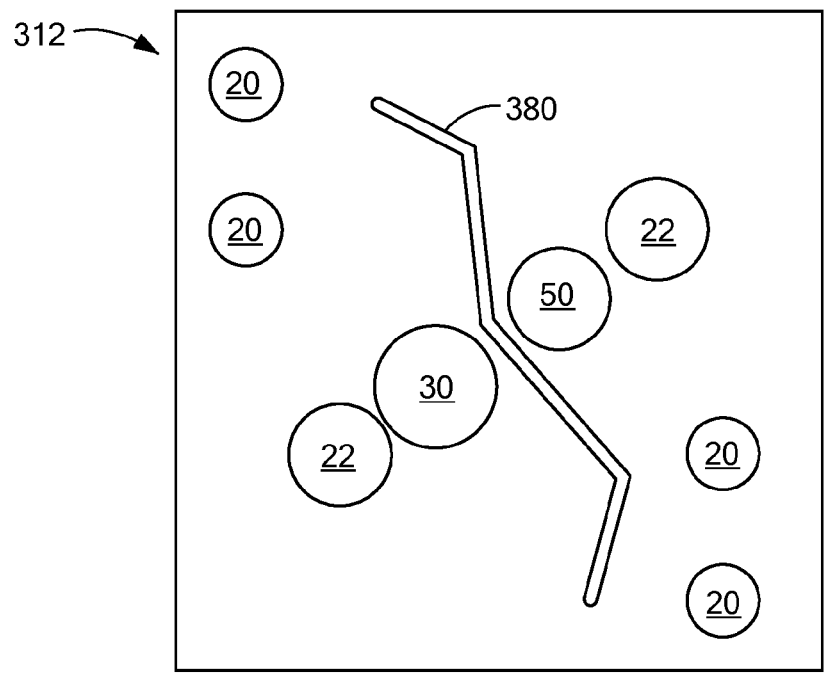
FIG. 14 is another embodiment of the slotted heat sink plate.

Although the illustrated embodiment shows the slot 80 as a linear slot, the slot 80 is not limited to this configuration. For example, the slot 80 may extend along the plate 12 in a non linear form, such as single smooth curve (280, FIG. 13), a serpentine (180, FIG. 12) or a zig-zag (380, FIG. 14). The aperture may be irregularly shaped, for example, it may be non-symmetric about a midpoint thereof or of non-uniform width. In some embodiments, the shape of the slot 80 may determined by forming a slot 80 of sufficient length while also providing a shape which provides sufficient distance from other plate features, such as the openings 20, 22, to permit adequate current flow without formation of hot spots.

Although the illustrated embodiment shows slotted heat sink plates 12 as applied to the thryristor switched capacitor, it is understood that the slotted heat sink plates 12 would have application to other switching systems including, but not limited to thyristor switched reactors.

A selected illustrative embodiment of the power electronic assembly including slotted thermally and electrically conductive plates to support semiconductor switching elements is described above in some detail. However, it should be understood that only structures considered necessary for clarifying the present invention have been described herein. Other conventional structures, and those of ancillary and auxiliary components of the system, are assumed to be known and understood by those skilled in the art. Moreover, while a working example of the present invention has been described above, the present invention is not limited to the working example described above, but various design alterations may be carried out without departing from the present invention as set forth in the claims.

What is claimed is:

1. A power electronic assembly comprising
a pair of thermally conductive plates;
semiconductor switching elements positioned between contact surfaces of the pair of thermally conductive plates, a first of the semiconductor switching elements positioned at a first region of the thermally conductive plates and a second of the semiconductor switching elements positioned at a second region of the thermally conductive plates; and
each plate of the pair of thermally conductive plates include an aperture positioned between the first region and the second region of the thermally conductive plates, such that in a compressed state, a contact surface of the at least one of the thermally conductive plates associated with the first region is substantially parallel to and offset from that of the second region in a direction parallel to the direction of compression.

2. The assembly of claim 1, wherein at least one of the thermally conductive plates comprises the contact surface and a second surface that is opposed to the contact surface, and the aperture of the at least one of the thermally conductive plates extends from the contact surface to the second surface.

3. The assembly of claim 1 wherein the aperture is elongated in the plane of the at least one of the thermally conductive plates.

4. The assembly of claim 1 wherein the aperture includes substantially parallel long sides connected at each end by short sides, and the ratio of length of long sides to short sides is about 50 to 1.

5. The assembly of claim 1 wherein the aperture includes substantially parallel long sides connected at each end by short sides, and the ratio of length of long sides to short sides is about 200 to 1.

6. The assembly of claim 1 wherein the aperture is elongated, and extends along a line substantially perpendicular to a line joining the first and the second of the semiconductor switching elements.

7. The assembly of claim 1 wherein the aperture includes long aperture sides joined by short aperture sides, and the first and the second semiconductor switching elements are located at a position spaced from the short aperture sides.

8. The assembly of claim 1 wherein the aperture includes long aperture sides joined by short aperture sides, and a line that connects the first and second semiconductor switching elements intersects the aperture at a location substantially midway between the short aperture sides.

9. The assembly of claim 1 wherein the aperture is linear.

10. The assembly of claim 1 wherein at least one of the thermally conductive plates provides an electrical connection between the first of the semiconductor switching elements and the second of the semiconductor switching elements.

11. The assembly of claim 1 wherein each of the first and second semiconductor switching elements includes a positive terminal and a negative terminal, and wherein one of the pair of thermally conductive plates provides an electrical connection between the positive terminal of the first semiconductor switching element and the negative terminal of the second semiconductor switching element, and the other of the pair of thermally conductive plates provides an electrical connection between the negative terminal of the first semiconductor switching element and the positive terminal of the second semiconductor switching element.

12. A power electronic valve comprising at least two assemblies according to claim 1, wherein the at least two assemblies are arranged so that the respective apertures are substantially aligned along a longitudinal axis of the power electronic valve.

13. A power electronic assembly comprising
a pair of thermally conductive plates;
semiconductor switching elements positioned between contact surfaces of the pair of thermally conductive plates, a first of the semiconductor switching elements positioned at a first region of the thermally conductive plates and a second of the semiconductor switching elements positioned at a second region of the thermally conductive plates; and
each plate of the pair of thermally conductive plates being configured so that in a compressed state, a contact surface of the at least one of the thermally conductive plates associated with the first region is substantially parallel to and offset from that of the second region in a direction parallel to the direction of compression due to resiliency of the thermally conductive plates.

* * * * *